(12) United States Patent
Kitagawa et al.

(10) Patent No.: US 10,518,380 B2
(45) Date of Patent: Dec. 31, 2019

(54) METHOD FOR SLICING WORKPIECE AND WIRE SAW

(71) Applicant: SHIN-ETSU HANDOTAI CO., LTD., Tokyo (JP)

(72) Inventors: Koji Kitagawa, Nishigo-mura (JP); Shiro Toyoda, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 9 days.

(21) Appl. No.: 15/762,371

(22) PCT Filed: Sep. 15, 2016

(86) PCT No.: PCT/JP2016/004224
§ 371 (c)(1),
(2) Date: Mar. 22, 2018

(87) PCT Pub. No.: WO2017/068748
PCT Pub. Date: Apr. 27, 2017

(65) Prior Publication Data
US 2018/0281147 A1    Oct. 4, 2018

(30) Foreign Application Priority Data
Oct. 20, 2015    (JP) .................................. 2015-206126

(51) Int. Cl.
*B24B 27/06*    (2006.01)
*B28D 5/00*    (2006.01)
(Continued)

(52) U.S. Cl.
CPC ........ *B24B 27/0633* (2013.01); *B28D 5/0082* (2013.01); *B28D 5/045* (2013.01); *H01L 21/304* (2013.01)

(58) Field of Classification Search
CPC .. B24B 27/0633; B28D 5/0082; B28D 5/045; H01L 21/304
See application file for complete search history.

(56) References Cited

U.S. PATENT DOCUMENTS 7,926,478 B2 *    4/2011    Nakai ................ B23D 57/0061
                                                    125/16.01
8,752,537 B2 *    6/2014    Kim ....................... B28D 5/045
                                                    125/16.02

(Continued)

FOREIGN PATENT DOCUMENTS

JP    H08-011047 A    1/1996
JP    H09-262826 A    10/1997
(Continued)

OTHER PUBLICATIONS

Nov. 22, 2016 International Search Report issued in International Patent Application No. PCT/JP2016/004224.

*Primary Examiner* — Omar Flores Sanchez
(74) *Attorney, Agent, or Firm* — Oliff PLC

(57) ABSTRACT

A method for slicing a workpiece using a wire saw which includes wire row formed by winding a fixed abrasive grain wire having abrasive grains secured to a surface around a plurality of grooved rollers, the method including feeding a columnar workpiece to wire row for slicing while allowing fixed abrasive grain wire to reciprocate and travel in an axial direction, thereby slicing the workpiece at a plurality of positions aligned in axial direction at same time. After end of slicing the workpiece, the fixed abrasive grain wire is rewound from position at the end of slicing the workpiece by length of ⅓ or more and ⅔ or less of the fixed abrasive grain wire fed's length from start of slicing when the workpiece and wire row begin to contact with each other to the end of slicing the workpiece, and then the workpiece is drawn out of wire row.

2 Claims, 2 Drawing Sheets

(51) Int. Cl.
*B28D 5/04* (2006.01)
*H01L 21/304* (2006.01)

(56) References Cited

U.S. PATENT DOCUMENTS

| | | | |
|---|---|---|---|
| 9,969,017 B2* | 5/2018 | Imakurusu | B24B 27/0633 |
| 2007/0023027 A1* | 2/2007 | Nakai | B23D 57/0061 |
| | | | 125/21 |
| 2010/0206285 A1* | 8/2010 | Kitagawa | B24B 27/0633 |
| | | | 125/16.02 |
| 2015/0202700 A1* | 7/2015 | Kondo | B28D 5/045 |
| | | | 125/16.01 |
| 2015/0290728 A1* | 10/2015 | Imakurusu | B24B 27/0633 |
| | | | 125/21 |
| 2015/0298228 A1* | 10/2015 | Huggenberger | B23D 57/0053 |
| | | | 125/16.02 |
| 2015/0314484 A1* | 11/2015 | Pietsch | B23D 57/0023 |
| | | | 125/21 |
| 2019/0112147 A1* | 4/2019 | Lei | B65H 59/18 |

FOREIGN PATENT DOCUMENTS

| | | |
|---|---|---|
| JP | 2002-254327 A | 9/2002 |
| JP | 2014-042956 A | 3/2014 |

* cited by examiner (a) AT END OF SLICING  (b) AT OCCURRENCE OF CATCH (c) END OF DRAWING-OUT (a) LOOSE ABRASIVE GRAIN SYSTEM (b) FIXED ABRASIVE GRAIN SYSTEM

METHOD FOR SLICING WORKPIECE AND WIRE SAW

TECHNICAL FIELD

The present invention relates to a method for slicing a workpiece and a wire saw.

BACKGROUND ART

As means for slicing off wafers from a workpiece such as a silicon ingot or a compound semiconductor ingot, wire saws have been conventionally known. In each of the wire saws, a wire row is formed by winding a slicing wire around a plurality of rollers in many turns, the slicing wire is driven in an axial direction at a high speed, and a workpiece is fed to the wire row for slicing while appropriately supplying slurry, whereby this workpiece is sliced at respective wire positions at the same time (see, e.g., Patent Literature 1).

Here, FIG. 3 shows an outline of an example of a conventional general wire saw. As shown in FIG. 3, this wire saw 101 is mainly constituted of a wire 102 (a high tensile steel wire) to slice a workpiece W, a wire row 104 formed by winding the wire 102 around a plurality of grooved rollers 103 and 103', tension imparting mechanisms 105 and 105' to impart tension to the wire 102, a workpiece feed mechanism 106 which feeds the workpiece W to be sliced toward a lower side, and a slurry supply mechanism 107 which supplies slurry having GC (silicon carbide) abrasive grains or the like dispersed in a liquid at the time of slicing.

The wire 102 is reeled out from one wire reel 108, and reaches the grooved roller 103 through the tension imparting mechanism 105. The wire 102 is wound around this grooved roller 103 in approximately 300 to 400 turns, and then taken up by the wire reel 108' through the other tension imparting mechanism 105'.

Further, the grooved roller 103 is a roller provided by press-fitting a polyurethane resin around a cylinder made of iron and steel and forming grooves on a surface thereof at a fixed pitch. The grooved roller 103 is configured in such a manner that the wound wire 102 can be driven in a reciprocating direction in a predetermined cycle by a driving motor 111.

It is to be noted that, at the time of slicing the workpiece W, the workpiece W is held and pushed down by the workpiece feed mechanism 106, and fed to the wire row 104 wound around the grooved rollers 103 and 103'. Such a wire saw 101 is used, appropriate tension is applied to the wire 102 by the tension imparting mechanism 105, the slurry fed from the slurry supply mechanism 107 is supplied through nozzles 109 while allowing the wire 102 to travel in the reciprocating direction by the driving motor 111, and the workpiece is fed for slicing by the workpiece feed mechanism 106, thereby slicing the workpiece.

On the other hand, there is also known a method for slicing a workpiece by using a fixed abrasive grain wire having diamond abrasive grains or the like secured to a surface of the wire in place of using slurry containing abrasive grains, and this has been partially put into practical use for slicing of small-diameter ingots each having a diameter of approximately 150 mm or less.

In this slicing using the fixed abrasive grain wire, a general wire saw can be used as it is by attaching the fixed abrasive grain wire in place of the steel wire of the wire saw shown in FIG. 3 and changing the slurry to a coolant such as cooling water which does not contain abrasive grains.

CITATION LIST

Patent Literature

Patent Literature 1: Japanese Unexamined Patent Application Publication No. Hei 9-262826

DISCLOSURE OF INVENTION

Problem to be Solved by the Invention

In slicing using the fixed abrasive grain wire, since loose abrasive grains are not used, it has a merit that an amount of industrial waste is small in environmental aspects. Further, it also has a merit that a processing rate is high, and has more conveniences than processing based on the wire saw using the loose abrasive grains. However, in the wire saw, as shown in FIG. 3, since the workpiece W is pressed against the one wire 102 wound around the grooved roller 103, moved, and sliced, the workpiece W is placed at the end of slicing on a lower side of the wire 103 against which the workpiece W was pressed. Thus, to take out the workpiece W, the workpiece W must be moved up to allow the wire 102 to pass through gaps between wafers sliced off from the workpiece W, and the wire 102 must be relatively drawn out toward the lower side.

At the time of drawing out the wire, in case of the wire saw using the loose abrasive grains, since a gap (a clearance) corresponding to a width of each loose abrasive grain G is formed between the wire 102 and the workpiece W as shown in FIG. 4(a), extraction of the wire 102 is relatively easy. However, as shown in FIG. 4(b), in case of the wire saw using the fixed abrasive grains, since no gap is formed between the fixed abrasive grain wire 402 and the workpiece W, the fixed abrasive grain wire 402 is hard to be drawn out. Thus, the fixed abrasive grain wire 402 is caught by the workpiece W and rises, trying drawing out the fixed abrasive grain wire 402 in this state causes damage to a workpiece cut section, so-called saw marks are formed on this cut section, and Warp is degraded to impair quality. When the rise of the fixed abrasive grain wire 402 has further increased, disconnection of the wire may occur. When the disconnection of the wire has occurred, an operation to again wind the fixed abrasive grain wire around the grooved rollers is required, and great loss such as a need for an extra length of the fixed abrasive grain wire for rewinding is exhibited.

In view of the problem, it is an object of the present invention to provide a method for slicing a workpiece and a wire saw which do not cause a wire to be caught by the workpiece and associated formation or saw marks or disconnection of the wire in extraction of the wire after slicing the workpiece.

Means for Solving Problem

To achieve the object, the present invention provides a method for slicing a workpiece with the use of a wire saw which includes a wire row formed by winding a fixed abrasive grain wire having abrasive grains secured to a surface thereof around a plurality of grooved rollers, the method including feeding a columnar workpiece to the wire row for slicing while allowing the fixed abrasive grain wire to reciprocate and travel in an axial direction, thereby slicing the workpiece at a plurality of positions aligned in the axial direction at the same time, the method being characterized in that, after end of slicing the workpiece, the fixed abrasive grain wire is rewound from a position at the end of slicing the workpiece by a length which is ⅓ or more and ⅔ or less of a length of the fixed abrasive grain wire fed from start of slicing when the workpiece and the wire row begin to contact with each other to the end of slicing the workpiece, and then the workpiece is drawn out of the wire row.

In case of slicing the columnar workpiece, the abrasive grains secured to the wire surface have the greatest amount of abrasion in a workpiece central portion due to a difference in slicing length, and the abrasion of the abrasive grains is reduced in any other portion. After the end of slicing the workpiece, when the fixed abrasive grain wire is rewound by the length falling within the range, a surface having a large amount of abrasion of the abrasive grains secured thereto in the surface of the fixed abrasive grain wire can be arranged to be adjacent to the workpiece, and the workpiece can be drawn out without being caught by the wire. Consequently, it is possible to prevent the wire from being caught by the wire to form saw marks or prevent disconnection of the wire from occurring.

At this time, as the columnar workpiece, a workpiece having a diameter of 300 mm or more can be sliced.

The method for slicing a workpiece according to the present invention is particularly effective when the columnar workpiece having a large diameter is sliced.

Further, to achieve the object, the present invention provides a wire saw including: a wire row formed by winding a fixed abrasive grain wire having abrasive grains secured to a surface thereof around a plurality of grooved rollers; and a workpiece feed mechanism which presses a columnar workpiece against the wire row while holding the same, the workpiece being sliced at a plurality of positions aligned in an axial position at the same time by feeding the workpiece to the wire row for slicing while allowing the fixed abrasive grain wire to reciprocate and travel in the axial direction, the wire saw being characterized in that the wire saw includes controlling means for controlling, after end of slicing the workpiece, to rewind the fixed abrasive grain wire from a position at the end of slicing the workpiece by a length which is ⅓ or more and ⅔ or less of a length of the fixed abrasive grain wire fed from start of slicing when the workpiece and the wire row begin to contact with each other to the end of slicing the workpiece, and then to draw the workpiece out of the wire row.

Since the wire saw according to the present invention can be controlled to rewind the fixed abrasive grain wire by the length falling within the range after the end of slicing, a surface having a large amount of abrasion of the abrasive grains secured thereto in the surface of the fixed abrasive grain wire can be arranged to be adjacent to the workpiece, and then the workpiece can be drawn out. Consequently, it is possible to prevent the wire from being caught by the wire to form saw marks or prevent disconnection of the wire from occurring.

Effect of the Invention

According to the method for slicing a workpiece and the wire saw of the present invention, in extraction of the wire after the end of slicing the workpiece, it is possible to prevent the wire from being caught by the wire to form saw marks or prevent disconnection of the wire from occurring.

BEST MODE(S) FOR CARRYING OUT THE INVENTION

An embodiment of the present invention will now be described hereinafter, but the present invention is not restricted thereto.

In case of slicing a workpiece by using a fixed abrasive grain wire as described above, there is a problem that, when drawing the wire out of the workpiece is tried after the end of slicing the workpiece, the wire is caught by the workpiece, saw marks are thereby formed on a section, or the wire is disconnected.

Thus, the present inventors have repeatedly conducted the earnest examination to solve such a problem. Consequently, they have found out that, when the fixed abrasive grain wire is rewound by an appropriate length in such a manner that a surface of the fixed abrasive grain wire having a large amount of abrasion of abrasive grains secured thereto becomes adjacent to the workpiece, a diameter of the fixed abrasive grain wire becomes smaller than a gap of the workpiece, and hence the wire can be prevented from being caught by the workpiece, thereby bringing the present invention to completion.

Figure 1:
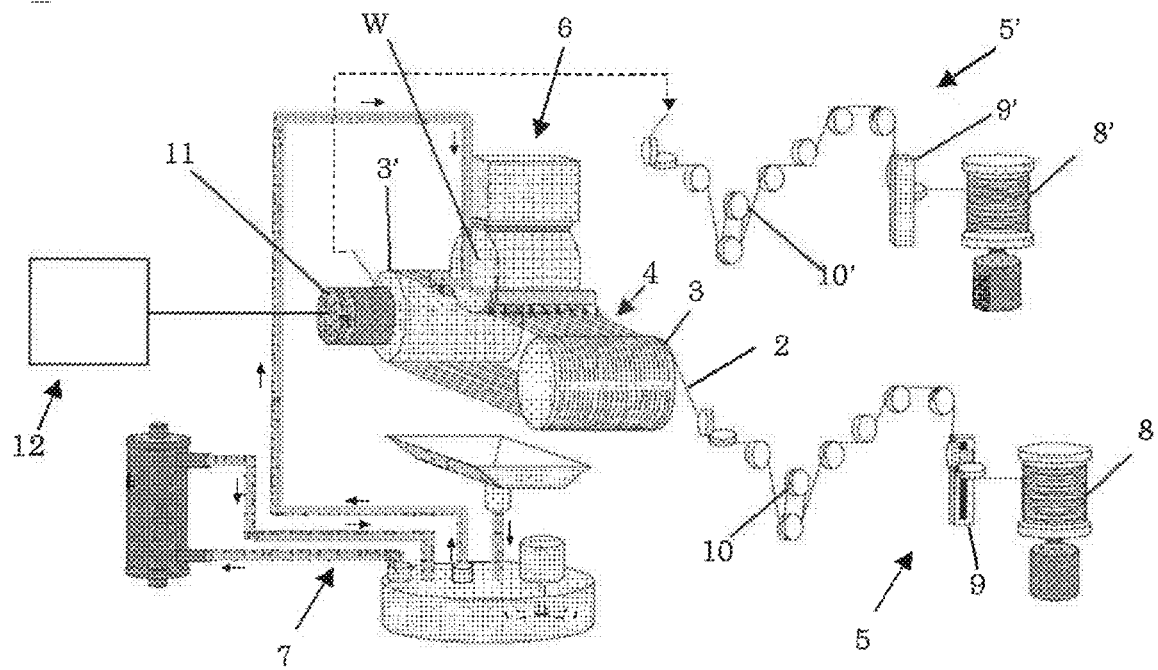
FIG. 1 is a schematic view showing an example of a wire saw according to the present invention.

FIG. 1 is a schematic view showing an example of a wire saw 1 according to the present invention. As shown in FIG. 1, the wire saw 1 according to the present invention is mainly constituted of a fixed abrasive grain wire 2 which is configured to slice a workpiece W and has abrasive grains secured to a surface thereof, a plurality of grooved rollers 3 and 3' around which the fixed abrasive grain wire 2 is wound, a wire row 4 formed by winding the fixed abrasive grain wire 2 around the grooved rollers 3 and 3', a tension imparting mechanism 5 and 5' configured to impart tension to the fixed abrasive grain wire 2, a workpiece feed mechanism 6 which feeds the workpiece W to be sliced toward a lower side, and a coolant supply mechanism 7 which supplies a coolant at the time of slicing.

The fixed abrasive grain wire 2 is fed from one wire reel 8, passes through the tension imparting mechanism 5 formed of a powder clutch (a low-torque motor 10), a dancer roller (a deadweight) (not shown), or the like via a traverser 9, and reaches the grooved roller 3. Furthermore, the fixed abrasive grain wire 2 is wound around the grooved rollers 3 and 3' in approximately 400 to 500 turns to enable forming the wire row 4. Moreover, the fixed abrasive grain wire 2 passes through the other tension imparting mechanism 5' formed of a powder clutch (a low-torque motor 10') or a dancer roller (a deadweight) (not shown) via a traverser 9' and is taken up by a wire reel 8'.

According to such a wire saw 1, when the workpiece W is fed to the wire row 4 for slicing while allowing the fixed abrasive grain wire 2 to reciprocate and travel in its axial direction, the workpiece W is sliced at a plurality of positions aligned in the axial direction at the same time. As to the reciprocatory traveling of the fixed abrasive grain wire 2, the fixed abrasive grain wire 2 wound around the plurality of grooved rollers 3 and 3' is advanced by a predetermined length in one direction and then retreated in the other direction by a length smaller than the advancing amount, this is determined as one feed cycle, and the wire is fed out in one direction by repeating this cycle. The grooved roller 3' is configured to drive the fixed abrasive grain wire 2 wound therearound in a reciprocating direction by using a driving motor 11 in a predetermined period.

Figure 2:
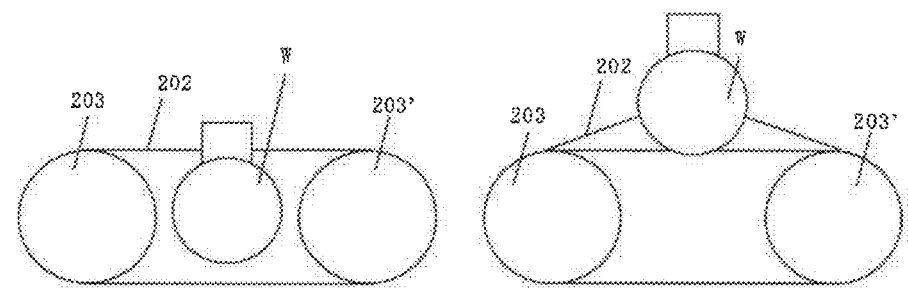
FIG. 2(a) is a view showing a positional relationship between a workpiece and a fixed abrasive grain wire after the end of slicing the workpiece, (b) is a view showing a state of the workpiece and the fixed abrasive grain wire when a catch of the wire has occurred, and (c) is a view showing a positional relationship between the workpiece and the fixed abrasive grain wire after the end of drawing out the workpiece.
Figure 2:
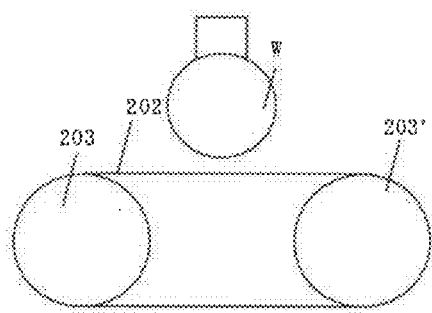
Figure 3:
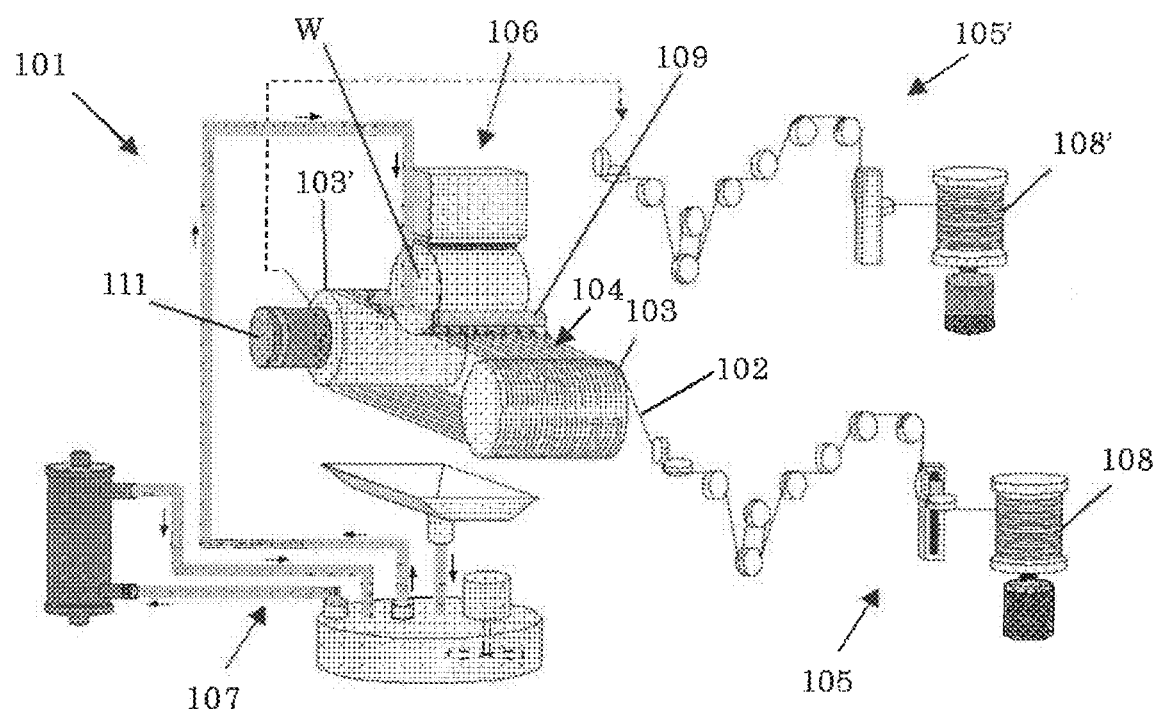
FIG. 3 is a schematic view showing an example of a conventional general wire saw.

Here, feeding and taking-up of the fixed abrasive grain wire will now be described in more detail. FIGS. 2(a) and (c) are views each showing a positional relationship between the workpiece W and the fixed abrasive grain wire 202 at the end of slicing the workpiece or at the end of drawing out the workpiece. As shown in FIG. 2(a), at the end of slicing, the workpiece W is placed on the lower side of the wire row. Thus, to take out the workpiece W, the wire 202 must be passed through the gaps between wafers of the workpiece, which has been sliced into the wafers, by moving up the workpiece W and relatively drawn out toward the lower side.

Figure 4:
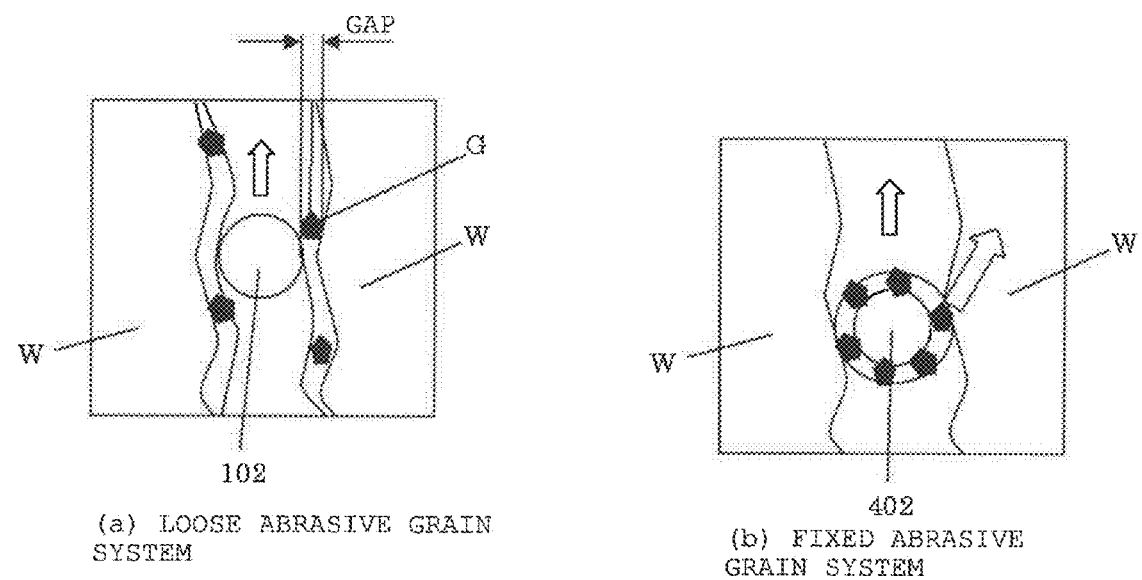
FIG. 4(a) is a view showing a state of a wire in a gap of a workpiece in a loose abrasive grain system, and (b) is a view showing a state of a fixed abrasive grain wire in a gap of a workpiece in a fixed abrasive grain system.

However, in case of the wire saw using the conventional fixed abrasive grain wire, since no clearance is formed between the fixed abrasive grain wire 202 and the workpiece W (see FIG. 4(b)), the fixed abrasive grain wire 202 is caught by the workpiece W and rises as shown in FIG. 2(b), and saw marks are formed on a section of the workpiece W, or disconnection of the wire occurs.

To avoid this problem, the wire saw 1 according to the present invention includes controlling means 12 which controls, after the end of slicing the workpiece W, to draw the workpiece W out of the wire row 4 after rewinding the fixed abrasive grain wire 2 from a position at the end of slicing the workpiece W by a length which is ⅓ or more and ⅔ or less of a length of the fixed abrasive grain wire 2 fed from the start of slicing when the workpiece W and the wire row begin to contact with each other to the end of slicing the workpiece W.

When the fixed abrasive grain wire 2 is rewound by a length which is ⅓ or more and ⅔ or less of a length of the fixed abrasive grain wire 2 fed from the start of slicing to the end of slicing the workpiece W by using its controlling means 12, a portion of the wire which has a large amount of abrasion of the abrasive grains can be arranged to be adjacent to the workpiece, thereby preventing the workpiece from being caught by the wire to form saw marks at the time of drawing out the workpiece or preventing the wire from being disconnected.

The method for slicing a workpiece according to the present invention will now be described based on an example where the wire saw of the present invention is used.

First, as shown in FIG. 1, the fixed abrasive grain wire 2 having the abrasive grains secured to the surface thereof is wound around the plurality of grooved rollers 3 and 3' to form the wire row 4. Then, the fixed abrasive grain wire 2 is allowed to reciprocate and travel in the axial direction of the fixed abrasive grain wire 2 by the driving motor 11.

Further, when the columnar workpiece W is fed to the wire column 4 for slicing by the workpiece feed mechanism 6, the workpiece W is sliced at a plurality of positions aligned in the axial direction at the same time.

According to the method for slicing a workpiece of the present invention, after the end of slicing the workpiece W, the fixed abrasive grain wire 2 is rewound from a position at the time of the end of slicing the workpiece W by a length which is ⅓ or more and ⅔ or less of a length of the fixed abrasive grain wire 2 fed from the start of slicing when the workpiece W and the wire row 4 begin to contact with each other to the end of slicing the workpiece W, and then the workpiece W is drawn out of the wire row 4.

Consequently, when the workpiece W is drawn out, a surficial portion of the fixed abrasive grain wire 2 having a large amount of abrasion of the abrasive grains can be arranged to be adjacent to the workpiece W, and it is possible to prevent the fixed abrasive grain wire 2 from being caught by the workpiece W to form saw marks or prevent the wire from being disconnected at the time of drawing out the workpiece W.

Furthermore, it is preferable to slice the columnar workpiece having a diameter of 300 mm or more. As a size of the workpiece increases, a length of the fixed abrasive grain wire which is adjacent to the workpiece and a distance to draw out the workpiece become longer, the fixed abrasive grain wire is apt to be caught, and hence the slicing method according to this application is particularly effective means.

EXAMPLES

The present invention will now be more specifically described hereinafter with reference to examples and comparative examples of the present invention, but the present invention is not restricted thereto.

Examples 1 to 4

Such a wire saw of the present invention as shown in FIG. 1 was used to slice a columnar workpiece in accordance with the slicing method of the present invention, and the workpiece was drawn out of the a wire row. As a fixed abrasive grain wire, one shown in the following Table 1 was used.

TABLE 1

| Core wire diameter | 0.140 mm |
| Diamond abrasive grain | 10 to 20 μm |
| Wire outer diameter (nominal) | 0.174 mm |
| Abrasive grain fixing method | Electrodeposition of nickel |

Moreover, workpiece slicing conditions and drawing conditions were Conditions 1 shown in the following Table 2. As described in Conditions 1 in Table 2, a length of the fixed abrasive grain wire fed from the start of slicing when the workpiece and the wire row begin to contact with each other to the end of slicing the workpiece (this length will be referred to as a wire used amount hereinafter) was set to 9000 m.

TABLE 2

|  |  | Conditions 1 | Conditions 2 |
|---|---|---|---|
| Workpiece | Diameter | 301 mm | 301 mm |
|  | Length | 300 mm | 300 mm |
| Wire traveling | Wire tension | 25 N | 25 N |

TABLE 2-continued

| | | Conditions 1 | Conditions 2 |
|---|---|---|---|
| conditions when workpiece is sliced | Wire traveling rate | Up to 1500 m/min | Up to 1500 m/min |
| | Wire advancing amount | 2114 m | 2128 m |
| | Wire retreating amount | 2086 m | 2072 m |
| | Wire used amount | 9000 m | 18000 m |
| Workpiece feed conditions when workpiece is sliced | Workpiece feed rate | 0.32 mm/min on average | 0.32 m/min on average |
| Wire traveling conditions when drawing-out is performed | Wire tension | 25 N | 25 N |
| | Wire traveling rate | Up to 5 m/min | Up to 5 m/min |
| | Wire advancing amount | 1 m | 1 m |
| | Wire retreating amount | 1 m | 1 m |
| Workpiece feed conditions when drawing-out is performed | Workpiece feed rate | 60 mm/min on average | 60 mm/min on average |
| Cooling water | Liquid type | Mixture of water + glycol | Mixture of water + glycol |
| | Coolant flow rate | Approximately 150 L/min | Approximately 150 L/min |
| | Coolant temperature | 23° C. | 23° C. |

Additionally, after the end of slicing the workpiece, the length of rewinding the fixed abrasive grain wire was changed in Examples 1 to 4 as shown in Table 3. As shown in Table 3, in Examples 1 to 4, the length of rewinding the fixed abrasive grain wire was set to be ⅓ or more and ⅔ or less of the wire used amount. It is to be noted that, as the workpiece, a columnar silicon single crystal ingot having a diameter of 301 mm and a length of 300 mm was sliced.

TABLE 3

| | Rewinding amount | Presence/absence of disconnection |
|---|---|---|
| Comparative Example 1 | 0 m | Disconnected |
| Comparative Example 2 | 1000 m | Disconnected |
| Comparative Example 3 | 2000 m | Disconnected |
| Example 1 | 3000 m | Not disconnected |
| Example 2 | 4000 m | Not disconnected |
| Example 3 | 5000 m | Not disconnected |
| Example 4 | 6000 m | Not disconnected |
| Comparative Example 4 | 7000 m | Disconnected |
| Comparative Example 5 | 8000 m | Disconnected |
| Comparative Example 6 | 9000 m | Disconnected |

In Examples 1 to 4 where the length of rewinding the fixed abrasive grain wire was set to be ⅓ or more and ⅔ or less of the wire used amount, presence/absence of disconnection of the fixed abrasive grain wire at the time of drawing the workpiece out of the wire row was checked, and there was no occurrence of the disconnection.

Comparative Examples 1 to 6

As shown in Table 3, a columnar workpiece was sliced under the same conditions as those in Example 1 except that a length of rewinding a fixed abrasive grain wire after the end of slicing the workpiece was set to be less than ⅓ of a wire used amount or more than ⅔ of the wire used amount, and the workpiece was drawn out of a wire row. It is to be noted that, as shown in Table 3, in Comparative Example 1, the length of rewinding the fixed abrasive grain wire after the end of slicing the workpiece was set to 0 m, i.e., the fixed abrasive grain wire was not rewound after slicing.

Consequently, as shown in Table 3, the wire was disconnected in each of Comparative Examples 1 to 6 where the length of rewinding the fixed abrasive grain wire was set to be less than ⅓ of the wire used amount or more than ⅔ of the wire used amount.

Examples 5 to 8

A workpiece was sliced and drawn out like Examples 1 to 4 except that the slicing conditions were changed to Conditions 2 in Table 2 and a wire advancing amount and a wire retreating amount were changed to set a wire used amount to 18000 m.

A rewinding amount of the fixed abrasive grain wire in each of Examples 5 to 8 was set as shown in Table 4.

TABLE 4

| | Rewinding amount | Presence/absence of disconnection |
|---|---|---|
| Comparative Example 7 | 0 m | Disconnected |
| Comparative Example 8 | 2000 m | Disconnected |
| Comparative Example 9 | 4000 m | Disconnected |
| Example 5 | 6000 m | Not disconnected |
| Example 6 | 8000 m | Not disconnected |
| Example 7 | 10000 m | Not disconnected |
| Example 8 | 12000 m | Not disconnected |
| Comparative Example 10 | 14000 m | Disconnected |
| Comparative Example 11 | 16000 m | Disconnected |
| Comparative Example 12 | 18000 m | Disconnected |

Consequently, as can be understood from Table 4, in each of Examples 5 to 8 where the length of rewinding the fixed abrasive grain wire was set to be ⅓ or more and ⅔ or less of the wire used amount, presence/absence of disconnection of the fixed abrasive grain wire at the time of drawing the workpiece out of the wire row was checked, and there was no occurrence of the disconnection.

Comparative Examples 7 to 12

As shown in Table 4, a columnar workpiece was sliced under the same conditions as those in Example 5 except that a length of rewinding a fixed abrasive grain wire after the end of slicing the workpiece was set to be less than ⅓ of a wire used amount or more than ⅔ of the wire used amount, and the workpiece was drawn out of a wire row.

Consequently, as shown in Table 4, the wire was disconnected in each of Comparative Examples 7 to 12 where the length of rewinding the fixed abrasive grain wire was set to be less than ⅓ of the wire used amount or more than ⅔ of the wire used amount.

It is to be noted that the present invention is not restricted to the embodiment. The embodiment is an illustrative example, and any example which has substantially the same structure and exerts the same functions and effects as the technical concept described in claims of the present invention is included in the technical scope of the present invention.

The invention claimed is:

1. A method for slicing a workpiece with the use of a wire saw which comprises a wire row formed by winding a fixed abrasive grain wire having abrasive grains secured to a surface thereof around a plurality of grooved rollers, the method comprising feeding a columnar workpiece to the wire row for slicing while allowing the fixed abrasive grain wire to reciprocate and travel in an axial direction, thereby slicing the workpiece at a plurality of positions aligned in the axial direction at the same time, wherein, after end of slicing the workpiece, the fixed abrasive grain wire is rewound from a position at the end of slicing the workpiece by a length which is ⅓ or more and ⅔ or less of a length of the fixed abrasive grain wire fed from start of slicing when the workpiece and the wire row begin to contact with each other to the end of slicing the workpiece, and then the workpiece is drawn out of the wire row.

2. The method for slicing a workpiece according to claim 1, wherein, as the columnar workpiece, a workpiece having a diameter of 300 mm or more is sliced.

* * * * *